(12) United States Patent
Chen

(10) Patent No.: US 11,515,105 B2
(45) Date of Patent: Nov. 29, 2022

(54) PUSH-BUTTON STRUCTURE, ELECTRONIC DEVICE, AND CONTROL METHOD

(71) Applicant: BEIJING XIAOMI MOBILE SOFTWARE CO., LTD., Beijing (CN)

(72) Inventor: Hao Chen, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 303 days.

(21) Appl. No.: 16/802,235

(22) Filed: Feb. 26, 2020

(65) Prior Publication Data

US 2021/0125798 A1    Apr. 29, 2021

(30) Foreign Application Priority Data

Oct. 28, 2019    (CN) .......................... 201911032724.3

(51) Int. Cl.
*H01H 13/14*    (2006.01)
*H01H 13/04*    (2006.01)

(52) U.S. Cl.
CPC ............ *H01H 13/14* (2013.01); *H01H 13/04* (2013.01)

(58) Field of Classification Search
CPC ......... H03K 17/97; H03K 2217/96038; H01H 13/04; H01H 13/14
See application file for complete search history.

(56) References Cited

U.S. PATENT DOCUMENTS

| 4,739,293 A * | 4/1988 | Hurley ................. H01H 50/163 335/194 |
| 9,425,008 B1 * | 8/2016 | Lee ........................ H03K 17/97 |
| 11,231,462 B1 * | 1/2022 | Cron ................. G01R 31/31813 |
| 11,232,921 B1 * | 1/2022 | King ....................... H05B 47/12 |
| 11,233,500 B1 * | 1/2022 | Kang ........................ G06F 1/12 |
| 11,233,501 B1 * | 1/2022 | Sze .......................... H03K 5/01 |
| 11,233,516 B1 * | 1/2022 | Whiteley ............... H03K 17/92 |
| 2010/0236911 A1 * | 9/2010 | Wild ...................... H01H 3/022 200/341 |
| 2017/0062168 A1 * | 3/2017 | Amirthasamy ...... H01H 13/063 |
| 2018/0059793 A1 * | 3/2018 | Hajati .................... H02K 33/02 |
| 2019/0176243 A1 * | 6/2019 | Fenollosa ......... B23B 29/03407 |

FOREIGN PATENT DOCUMENTS

| CN | 11024672 | * | 9/2019 | ............ H03K 17/97 |
| CN | 110246726 A | | 9/2019 | |
| EP | 2005281 A1 | | 12/2008 | |
| EP | 2028586 A1 | | 2/2009 | |
| WO | 2008012491 A1 | | 1/2008 | |

OTHER PUBLICATIONS

Supplementary European Search Report in the European application No. 20160545.8, dated Sep. 18, 2020.

* cited by examiner

*Primary Examiner* — Jared Fureman
*Assistant Examiner* — Esayas G Yeshaw
(74) *Attorney, Agent, or Firm* — Arch & Lake LLP

(57) ABSTRACT

A push-button structure includes: a mounting body, an outer surface of the mounting body being at least partially recessed inward to form a blind hole; a first magnetic component, located in the blind hole; a second magnetic component, located on an inner surface of the mounting body and distributed symmetrically with the first magnetic component on an opposite side of the mounting body, for generating, based on a distance to the first magnetic component, a magnetic signal corresponding to the distance; and an elastic block, located in the blind hole and having a first form without an external action and a second form under an external action.

17 Claims, 6 Drawing Sheets

PUSH-BUTTON STRUCTURE, ELECTRONIC DEVICE, AND CONTROL METHOD

CROSS-REFERENCE TO RELATED APPLICATION

This application is based upon and claims priority to Chinese Patent Application No. 201911032724.3 filed on Oct. 28, 2019, the entire contents of which are incorporated herein by reference.

TECHNICAL FIELD

The disclosure relates to the technical field of electronic devices, and more particularly, to a push-button structure, an electronic device and a control method.

BACKGROUND

Generally, a physical push-button or a pressure-sensitive push-button is provided in an electronic device such as a mobile phone. The physical push-button mainly includes a push-button cap located on an outer surface of a side wall of a housing of the electronic device, a switch component located in the side wall of the housing of the electronic device, and a Flexible Printed Circuit (FPC) board.

However, the electronic device provided with the physical push-button often has a poor sealing performance, which is prone to problems such as damage to a mainboard, and leads to damage to the electronic device. Although the electronic device provided with the pressure-sensitive push-button has a better sealing performance, a user may feel worse when using the pressure-sensitive push-button than the physical push-button, which may degrade the user experience.

SUMMARY

In view of this, the disclosure provides a push-button structure, an electronic device and a control method.

According to a first aspect of the disclosure, a push-button structure is provided. The push-button structure may include: a mounting body, an outer surface of the mounting body being at least partially recessed inward to form a blind hole; a first magnetic component, disposed at least partially in the blind hole; a second magnetic component, disposed at least partially on an inner surface of the mounting body and distributed symmetrically with the first magnet on an opposite side of the mounting body, for generating, based on a distance to the first magnetic component, a magnetic signal corresponding to the distance; and an elastic block, disposed at least partially in the blind hole and having a first form without any external action and a second form under an external action. When the elastic block is in the first form, a first distance may exist between the first magnetic component and the second magnetic component. When the elastic block is in the second form, a second distance may exist between the first magnetic component and the second magnetic component. The first distance may be greater than the second distance.

According to a second aspect of the disclosure, an electronic device is provided. The electronic device may include: a push-button structure provided in the first aspect of the disclosure, where a mounting body of the push-button structure is a middle frame of the electronic device; and a device body, provided in the middle frame, and including a functional element, where the electronic device executes functions corresponding to the push-button structure according to a magnetic signal output by the push-button structure.

According to a third aspect of the disclosure, a control method for an electronic device is provided. The method may be applied to an electronic device provided in the second aspect of the disclosure. The control method may include: generating, based on a distance between a second magnetic component in a push-button structure and a first magnetic component, a magnetic signal corresponding to the distance by the second magnetic component, wherein the distance between the first magnetic component and the second magnetic component changes under an external action, an elastic block in the push-button structure has a first form without the external action and a second form under the external action; when the elastic block is in the first form, a first distance exists between the first magnetic component and the second magnetic component; when the elastic block is in the second form, a second distance exists between the first magnet and the second magnetic component; and the first distance is greater than the second distance; and executing or stopping executing functions corresponding to the push-button structure based on the magnetic signal.

It is to be understood that the above general descriptions and detailed descriptions below are only exemplary and explanatory and not intended to limit the disclosure.

BRIEF DESCRIPTION OF THE DRAWINGS

The accompanying drawings, which are incorporated in and constitute a part of this specification, illustrate examples consistent with the disclosure and, together with the specification, serve to explain the principles of the disclosure.

DETAILED DESCRIPTION

Reference will now be made in detail to examples, which are illustrated in the accompanying drawings. The following description refers to the accompanying drawings in which the same numbers in different drawings represent the same or similar elements unless otherwise represented. The implementations set forth in the following description of examples do not represent all implementations consistent with the disclosure. Instead, they are merely examples of apparatuses and methods consistent with aspects related to the disclosure as recited in the appended claims.

Figure 1:
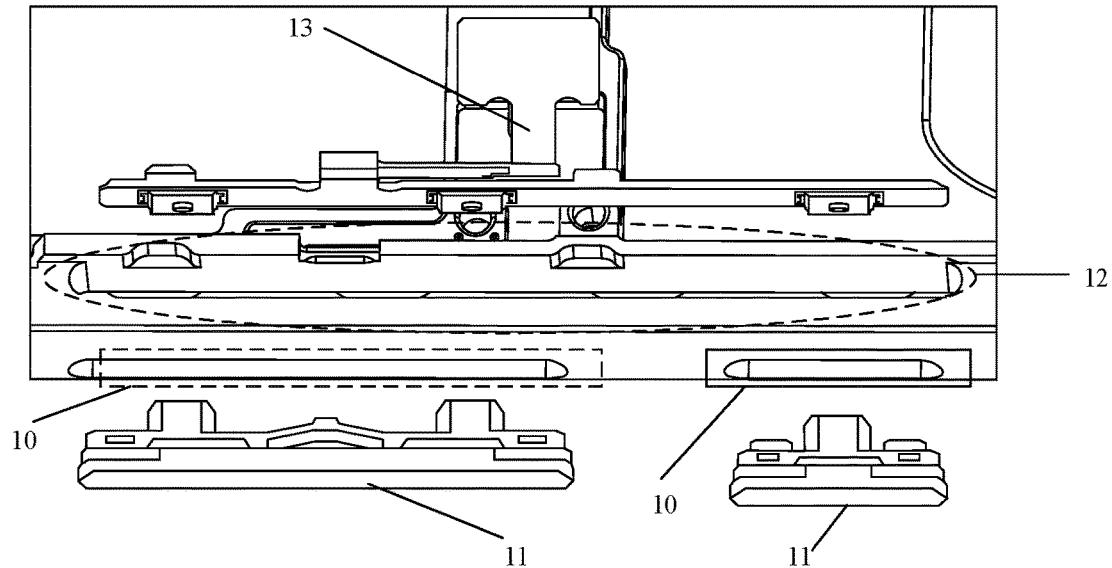
FIG. 1 is a schematic diagram illustrating part of an electronic device according to an example.

FIG. 1 is a schematic diagram illustrating part of an electronic device according to an example. As shown in FIG. 1, a groove 10 is provided on a side wall of a middle frame of the electronic device for mounting a push-button body 11. A circuit structure 13 (such as a switch component and an FPC component) of the push-button structure is provided inside the middle frame. In order to meet the routing requirements of the FPC and the mounting requirements of the circuit structure 13, an opening 12 is provided on a side of the middle frame of the mobile terminal facing a rear cover of a battery, and the opening 12 communicates with the groove 10.

Figure 2:
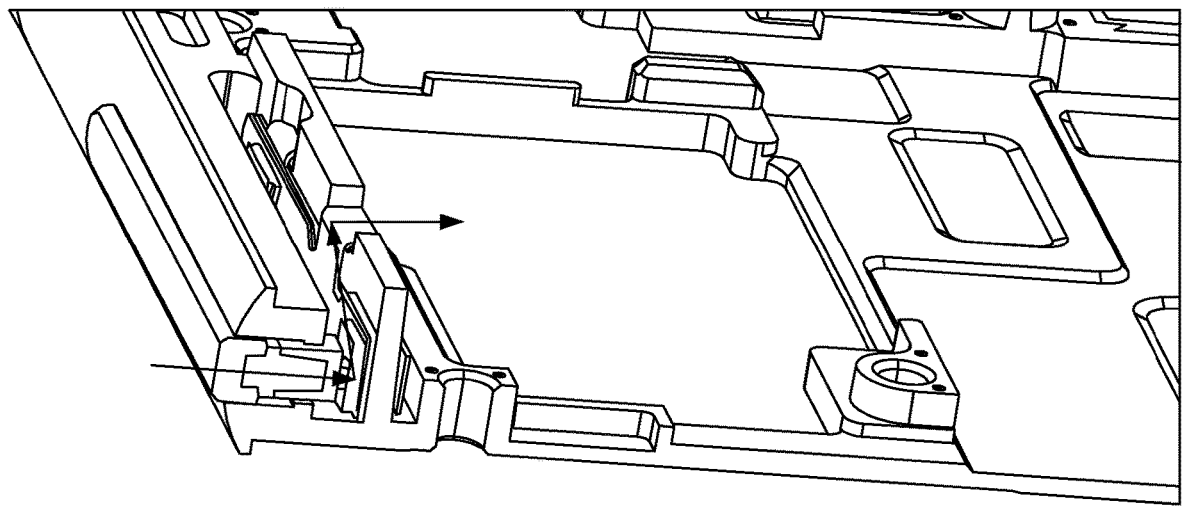
FIG. 2 is a partial schematic diagram illustrating another electronic device according to an example.

Since the groove 10 communicates with an external environment and the groove 10 communicates with the opening 12, a liquid such as water or a corrosive gas in the external environment can enter the opening 12 along the groove 10 from the outside via a path as shown by the arrowed lines in FIG. 2, and enter a housing of the electronic device through the opening 12 communicating with the interior of the housing of the electronic device, so that the liquid such as water or the corrosive gas can be in contact with a circuit board of the electronic device to cause short circuit inside the electronic device. As a result, functions of the electronic device may be at least partially damaged, and an economic loss may be brought to a user.

Figure 3:
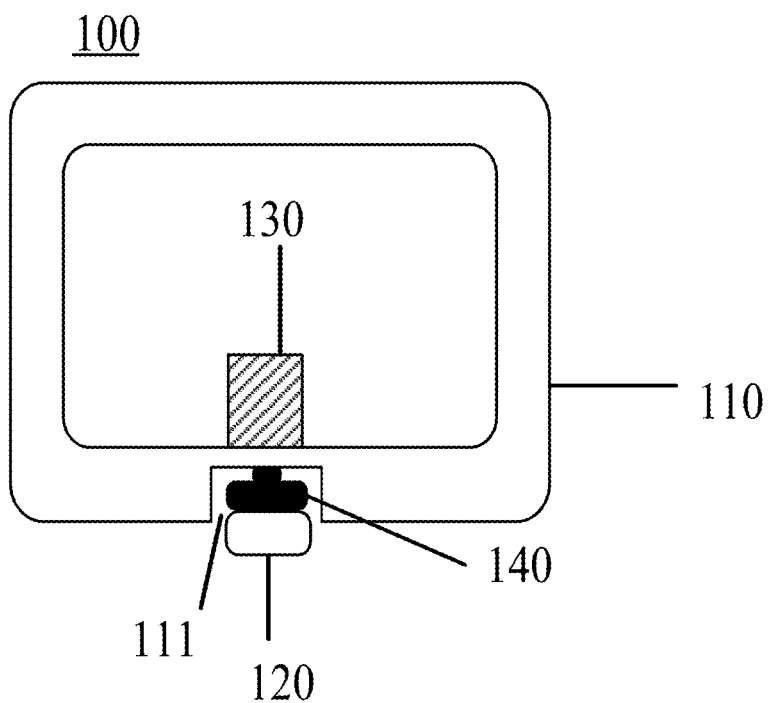
FIG. 3 is a schematic diagram illustrating a push-button structure according to an example.

FIG. 3 is a schematic diagram illustrating a push-button structure 100 according to an example. As shown in FIG. 3, the push-button structure 100 includes:

a mounting body 110, where an outer surface of the mounting body is at least partially recessed inward to form a blind hole 111;

a first magnetic component 120, at least partially located in the blind hole 111;

a second magnetic component 130, at least partially located on an inner surface of the mounting body 110 and distributed on a side of the mounting body 110 symmetrically with the first magnetic component 120 on an opposite side, for generating, based on a distance to the first magnetic component 120, a magnetic signal corresponding to the distance; and an elastic block 140, at least partially located in the blind hole 111 and having a first form without an external action and a second form under an external action.

When the elastic block 140 is in the first form, a first distance may exist between the first magnetic component 120 and the second magnetic component 130. When the elastic block 140 is in the second form, a second distance may exist between the first magnetic component 120 and the second magnetic component 130. The first distance may be greater than the second distance.

In an example, a constituent material of the mounting body 110 can allow a magnetic field to be transferred between the outer surface of the mounting body and the inner surface of the mounting body. For example, the constituent material of the mounting body 110 may include a magnetizer.

In a case that the push-button structure 100 is mounted in an electronic device, the mounting body 110 may be a frame body of the electronic device. For example, the electronic device is a mobile phone. The mounting body 110 may be a middle frame of the mobile phone.

The first magnetic component 120 may include an element capable of maintaining magnetic properties in an open circuit state. Specifically, the first magnetic component 120 may include a permanent magnet. A constituent material of the permanent magnet may include: an alloy permanent magnet material, such as a rare-earth permanent magnet material, or a ferrite permanent magnet material.

The second magnetic component 130 may include an element capable of sensing a variation of a magnetic flux and generating a magnetic signal according to the variation of the magnetic flux. Specifically, the second magnetic component 130 may include a magnetic field sensor. The magnetic field sensor may include a magnetoresistive sensor, a magnetic liquid acceleration sensor, and the like. The elastic block 140 may include an element capable of elastically deforming. For example, the elastic block may include at least one spring, elastic rubber, elastic plastic, an elastic sheet, and the like.

It is to be noted that when the elastic block 140 is converted from the first form to the second form under an external action, the first magnetic component 120 may approach the second magnetic component 130 by the elastic block, so that the distance between the first magnetic component 120 and the second magnetic component 130 can be reduced from the first distance to the second distance. Here, the external action may include a pressing action of a user.

When the external action is canceled or stopped, the elastic block 140 can be converted from the second form to the first form, and the first magnetic component 120 can move away from the second magnetic component 130 by the elastic block, so that the distance between the first magnetic component 120 and the second magnetic component 130 can be increased from the second distance to the first distance.

In some examples, the elastic block 140 can be at least partially located between the first magnetic component 120 and a bottom of the blind hole 111.

Specifically, for example, the elastic block 140 includes elastic plastic. When the elastic plastic is in the first form, the elastic plastic has a first length. When the elastic plastic is in the second form, the elastic plastic has a second length. The second length may be smaller than the first length.

For example, the elastic block 140 includes at least one spring. In a case that the at least one spring is located between the first magnetic component 120 and the bottom of the blind hole 111, the at least one spring can be compressed by the first magnetic component 120 and the bottom of the blind hole 111 to change the length of the at least one spring when being switched between the first form and the second form.

By arranging the elastic block 140 between the first magnetic component 120 and the bottom of the blind hole 111, the surface of the first magnetic component 120 exposed from the top of the blind hole may be pressed to switch the elastic block 140 from the first form to the second form under an extrusion action of the first magnetic component 120 and the bottom of the blind hole 111, so that the length of the elastic block 140 can be reduced from the first length to the second length. That is, the distance between the first magnetic component 120 and the second magnetic component 130 can be reduced from the first distance to the second distance, so that the second magnetic component 130 can generate a magnetic signal to achieve a push-button function.

Compared with the situation that a through hole communicating an outer side face of a middle frame with a side of the middle frame facing a rear cover of a battery is provided in an electronic device to mount a physical push-button and to transmit a signal generated by circuit connection based on a user pressing operation, the examples of the disclosure have the advantages that based on the first magnetic component provided in the blind hole formed in the outer surface of the mounting body and the elastic block 140 having a first form without an external action and a second form under an external action, a distance between the first magnetic component 120 and the second magnetic component 130 can be changed, so that the second magnetic component 130 can generate a magnetic signal corresponding to the distance, the electronic device can be triggered according to the magnetic signal to execute functions corresponding to the push-button structure 100. The through hole is not needed to be arranged in the middle frame of the electronic device, thereby reducing the probability of short circuit of a motherboard of the electronic device or damage to some functional elements caused by the fact that a liquid such as water or a corrosive substance enters the electronic device through the through hole, and improving the sealing property and corrosion resistance of the electronic device.

In addition, due to the form change of the elastic block 140 under an external action, the disclosure ensures that a user has the same or similar hand feel when using the electronic device with the push-button structure 100 as that when using the physical push-button in the related art, which is beneficial to improving the user experience.

Figure 4:
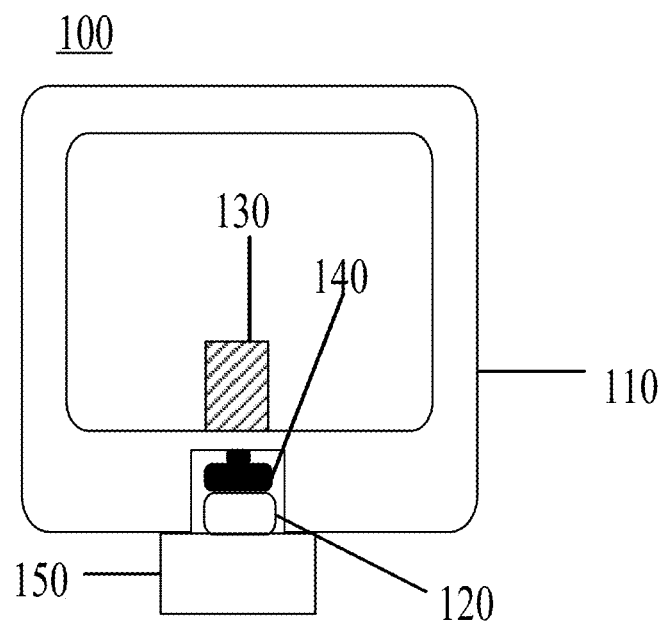
FIG. 4 is a schematic diagram illustrating another push-button structure according to an example.
Figure 5:
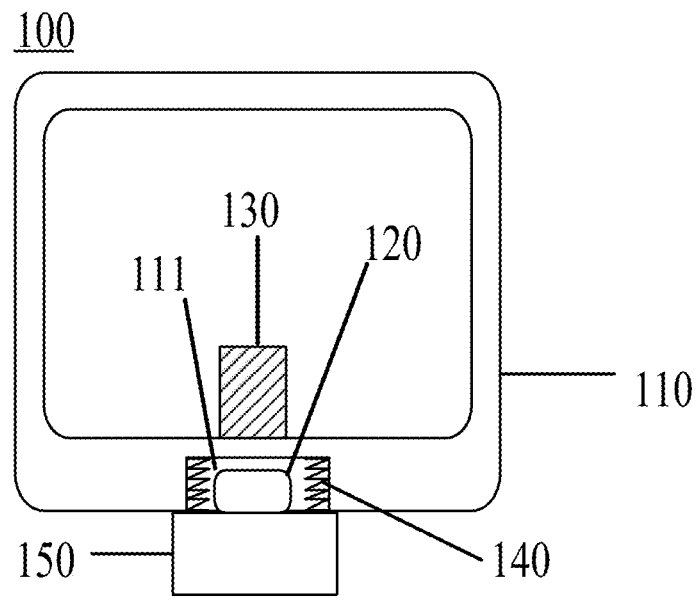
FIG. 5 is a schematic diagram illustrating still another push-button structure according to an example.

In some examples, as shown in FIG. 4 and FIG. 5, the push-button structure 100 includes a push-button housing 150, located on an outer surface of the first magnetic component 120 and configured to receive an external action.

In an example, the area of the push-button housing 150 may be adapted to the area of the opening of the blind hole 111, thereby reducing a distance between the push-button housing 150 and the opening of the blind hole 111, reducing dust and other pollutants entering the blind hole 111, and ensuring the quality of the push-button structure 100.

In addition, the outer surface of the push-button housing 150 may be provided with an uneven pattern, which is beneficial to improving the tactility of the user using the push-button structure. In addition, the outer surface of the push-button housing 150 can be a surface of the push-button housing touched by the user when pressing the push-button housing.

In some examples, as shown in FIG. 5, the elastic block 140 can be at least partially located between the push-button housing 150 and the bottom of the blind hole 111.

For example, the elastic block 140 includes at least one spring. In a case that the at least one spring is located between the push-button housing 150 and the bottom of the blind hole 111, the at least one spring can be compressed by the push-button housing 150 and the bottom of the blind hole 111 to change the length of the at least one spring when being switched between the first form and the second form.

Since the first magnetic component 120 is usually made of a rigid material, the deformation of the first magnetic component 120 may be small under an external action, and it can be considered that the thickness of the first magnetic component 120 does not change. Therefore, in some examples, in a case that the at least one spring is located between the push-button housing and the bottom of the blind hole, the length of the at least one spring in the first form may be greater than the thickness of the first magnetic component 120.

Figure 6:
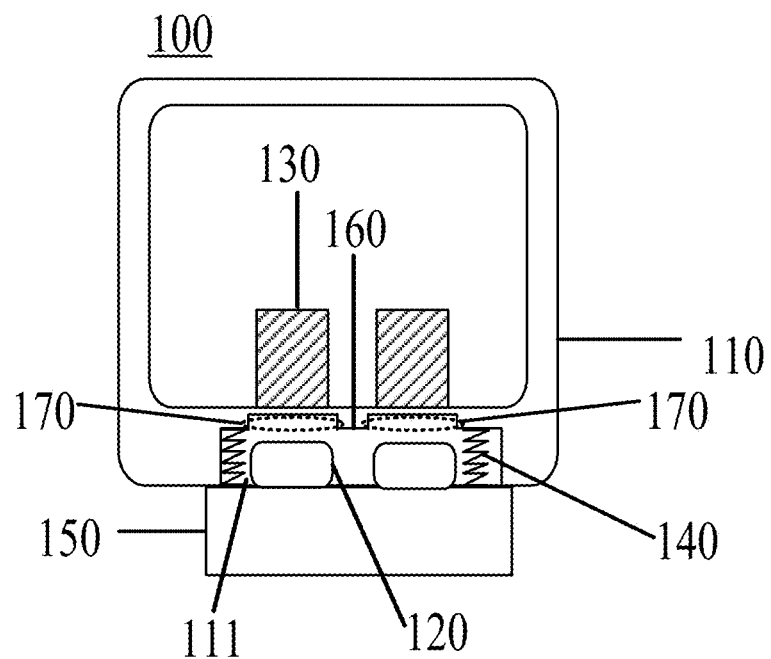
FIG. 6 is a schematic diagram illustrating still another push-button structure according to an example.

In some examples, as shown in FIG. 6, a partition 160 can be provided in the blind hole 111, and a receiving space 170 can be formed between the partition 160 and the bottom of the blind hole 111.

When the elastic block 140 has the first form, the first magnetic component 120 may be located in the blind hole 111 outside the receiving space 170.

When the elastic block 140 has the second form, the first magnetic component 120 may at least partially enter the receiving space 170 through the opening in the partition 160.

In the examples of the disclosure, the partition 160 may be provided in the blind hole 111 and the receiving space 170 may be formed between the partition 160 and the bottom of the blind hole 111, so that when the elastic block 140 has the first form, the first magnetic component 120 can be located in the blind hole 111 outside the receiving space 170, and when the elastic block 140 has the second form, the first magnetic component 120 can at least partially enter the receiving space 170 through the opening in the partition 160. The space where the first magnetic component 120 is movable in the blind hole 111 can be increased, thereby improving a distance variation between the first magnetic component 120 and the second magnetic component 130 when the elastic block 140 is switched between the first form and the second form, further improving the detection accuracy of a magnetic field variation generated by the second magnetic component 130 with respect to the first magnetic component 120, and improving the sensitivity of the push-button structure 100.

In addition, compared with a scheme of providing a blind hole with the bottom parallel to the opening and increasing the depth of the blind hole, the disclosure can reduce the size of the blind hole 111 while increasing a moving space between the first magnetic component 120 and the second magnetic component 130, increase the strength of the push-button structure 100, and ensure the quality of the push-button structure 100.

In some examples, the second magnetic component 130 is configured to generate a first magnetic signal when the elastic block 140 is switched from the first form to the second form. The first magnetic signal can trigger an electronic device to execute functions corresponding to the push-button structure 100.

The second magnetic component 130 is further configured to generate a second magnetic signal when the elastic block 140 is switched from the second form to the first form. The second magnetic signal can stop executing the functions corresponding to the push-button structure 100.

When the elastic block 140 is converted from the first form to the second form under an external action, the distance between the first magnetic component 120 and the second magnetic component 130 may be reduced from the first distance to the second distance. In such a case, the second magnetic component 130 may generate a first magnetic signal. The first magnetic signal may indicate that the push-button structure 100 is pressed by a user, and the user needs the electronic device to execute the functions corresponding to the push-button structure 100.

When the external action is canceled or stopped and the elastic block 140 is converted from the second form to the first form, the distance between the first magnetic component 120 and the second magnetic component 130 may be increased from the second distance to the first distance. In such a case, the second magnetic component 130 can generate a second magnetic signal. The second magnetic signal may indicate that a user stops pressing the push-button structure 100, and the user needs the electronic device to stop executing the functions corresponding to the push-button structure 100.

In an example, the first magnetic signal and the second magnetic signal may both be current signals. In such a case, signal values of the first magnetic signal and the second magnetic signal may be different, or directions of the first magnetic signal and the second magnetic signal may be different.

According to the disclosure, the second magnetic component may generate a first magnetic signal when the elastic block is switched from the first form to the second form, and generate a second magnetic signal when the elastic block is switched from the second form to the first form, so that the process of applying a pressing action once by a user can be clearly distinguished from the process of canceling the pressing action on the push-button structure 100 by the user, a system of the electronic device can be enabled to record the operations of applying pressing once and canceling pressing on the push-button structure 100 by the user. Moreover, when the first magnetic signal is generated, the electronic device can be triggered to execute the functions corresponding to the push-button structure 100, and when the second magnetic signal is generated, the electronic device can stop executing the functions corresponding to the push-button structure 100, so as to implement control of the electronic device.

Figure 7:
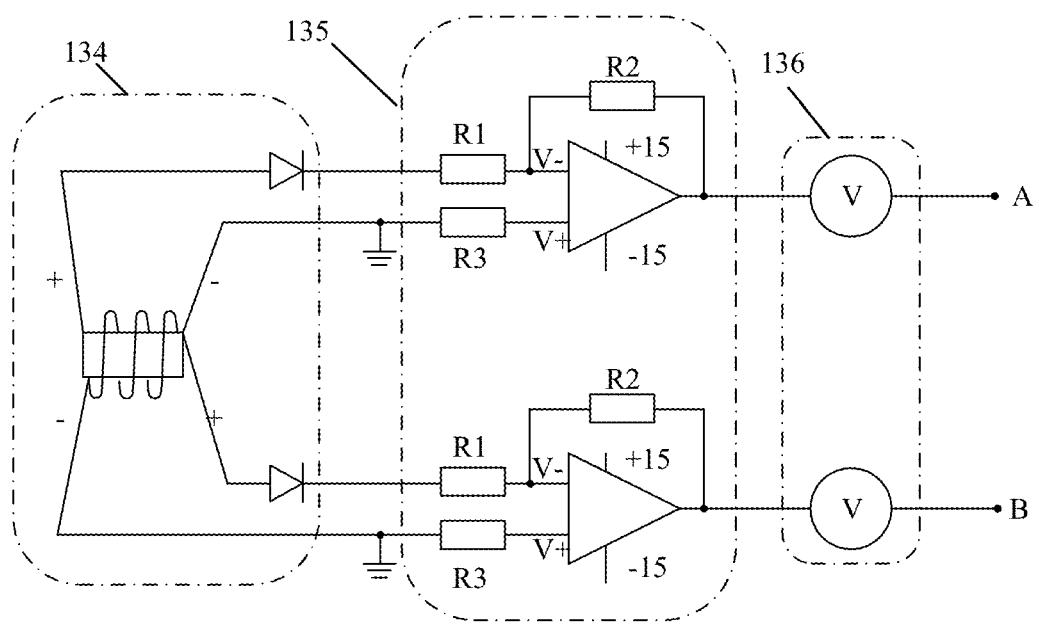
FIG. 7 is a schematic diagram illustrating a second magnetic component according to an example.

In some examples, as shown in FIG. 7, the second magnetic component 130 includes:

a detector 134, configured to generate a magnetic signal when a distance between the second magnetic component 130 and the first magnetic component 120 changes;

a signal converter 135, connected to the detector 134, configured to convert the magnetic signal into a first voltage signal by using a first sub-converter when a direction of the magnetic signal is consistent with a preset direction, and also configured to convert the magnetic signal into a second voltage signal by using a second sub-converter when the direction of the magnetic signal is opposite to the preset direction; and a controller 136, connected to the signal converter 135, and configured to generate a first driving signal when the first voltage signal satisfies a preset condition, where the electronic device triggers the functions corresponding to the push-button structure 100 according to the first driving signal.

The controller 136 is also configured to generate a second driving signal when the second voltage signal satisfies the preset condition, where the electronic device stops executing the functions corresponding to the push-button structure 100 according to the second driving signal.

In an example, the detector 134 may include a coil. A constituent material of the coil may include metal. Here, a magnetic signal may be an induced current signal generated according to a variation of a magnetic flux passing through the coil. In a case that a projected area of the coil in a direction perpendicular to a magnetic field is constant, the variation of the magnetic flux may have a positive correlation with a variation of a magnetic field intensity. It will be appreciated that when the coil is energized and the magnetic flux passing through the coil changes, an induced current signal can be generated in the coil.

For example, the detector 134 may be a coil, and the coil may be located in a magnetic field generated by the first magnetic component 120. When the coil is energized and the elastic block is converted from the first form to the second form under an external action, the distance between the first magnetic component 120 and the second magnetic component 130 can be reduced from the first distance to the second distance, the distance between the first magnetic component 120 and the coil can be also reduced, and the magnetic flux passing through the coil can be increased. Therefore, a first current signal may be generated in the coil, and a direction of the first current signal may be a first direction. Here, the direction of the first current signal may be determined according to a right-hand rule, and a preset direction may be the first direction.

When the external action is canceled or stopped, the elastic block may be converted from the second form to the first form, the distance between the first magnetic component 120 and the second magnetic component 130 can be increased from the second distance to the first distance, the distance between the first magnetic component 120 and the coil can be also increased, and the magnetic flux passing through the coil can be decreased. In such a case, a second current signal may be generated in the coil, a direction of the second current signal may be a second direction, and the direction of the second current signal may also be determined according to the right-hand rule. Here, the first direction may be opposite to the second direction.

In an example, the detector 134 may further include at least two diodes.

In a case that the detector 134 includes two diodes, an input end of the first diode may be connected to a first output end of the coil, and an output end of the first diode may be connected to the first sub-converter in the signal converter 135. An input end of the second diode may be connected to a second output end of the coil, and an output end of the second diode may be connected to the second sub-converter in the signal converter 135.

The first diode is configured to conduct a path through which the first current signal in the first direction flows from the energized coil to the first sub-converter when the first current signal is generated in the coil.

The first diode is further configured to block a path through which the second current signal in the second direction flows from the coil to the first sub-converter when the second current signal is generated in the coil. Here, when the second current signal in the second direction is transmitted to the first sub-converter, the first sub-converter may be damaged. Therefore, the first sub-converter may be protected due to the arrangement of the first diode.

The second diode is configured to conduct a path through which the second current signal in the second direction flows from the coil to the second sub-converter when the second current signal is generated in the coil.

The second diode is further configured to block a path through which the first current signal in the first direction flows from the coil to the second sub-converter when the first current signal is generated in the coil. Here, when the first current signal is transmitted to the second sub-converter, the second sub-converter may be damaged. Therefore, the second sub-converter may be protected due to the arrangement of the second diode.

With reference to FIG. 7, when the first current signal in the first direction is generated in the coil, the first diode can allow the first current signal to be conducted from the coil to the first sub-converter, and the second diode can block the conduction of the first current signal to the second sub-converter. The first sub-converter can convert the first current signal into a first voltage signal, and the controller 136 may generate a first driving signal when the first voltage signal satisfies a preset condition. That is, the first driving signal may be output at a node A.

When the second current signal in the second direction is generated in the coil, the first diode can block the conduction of the second current signal from the coil to the first sub-converter, and the second diode can allow the second current signal to be conducted to the second sub-converter. The second sub-converter can convert the second current signal into a second voltage signal, and the controller 136 may generate a second driving signal when the second voltage signal satisfies the preset condition. That is, the second driving signal may be output at a node B.

In the examples of the disclosure, a detector may be formed by a coil and at least two diodes, an input end of the first diode may be connected to a first output end of the coil, an output end of the first diode may be connected to the first sub-converter in the signal converter 135, an input end of the second diode may be connected to a second output end of the coil, and an output end of the second diode may be connected to the second sub-converter in the signal converter 135, so that the detector may conduct current signals in different directions through different paths in a case that the current signals generated in the coil are in different directions, thereby outputting different driving signals at different nodes to implement detection of directions of the current signals generated in the coil. That is, the detector may also be configured to detect the direction of a generated magnetic signal.

In an example, the signal converter 135 may include an operational amplifier.

The first sub-converter may include: a first operational amplifier, configured to convert a first current signal with a first signal value into a first current signal with a second signal value. The first signal value may be smaller than the second signal value.

The second sub-converter may include: a second operational amplifier, configured to convert a second current signal with a third signal value into a second current signal with a fourth signal value. The third signal value may be smaller than the fourth signal value.

It will be appreciated that both the first current signal with the first signal value and the second current signal with the third signal value generated in the coil have small signal values, and it may be difficult and inaccurate to directly detect the first current signal with the first signal value and the second current signal with the third signal value. If a controller with higher sensitivity is provided to detect the first current signal with the first signal value and the second current signal with the third signal value, the hardware cost may be increased. In the examples of the disclosure, the first current signal and the second current signal with the amplified signal values can be detected due to the arrangement of the signal converter 135, thereby reducing the detection difficulty, improving the detection accuracy of the push-button structure, and improving the sensitivity of the push-button structure.

In addition, the first operational amplifier may be further configured to convert the first current signal with the first signal value into a first voltage signal, or convert the first current signal with the second signal value into a first voltage signal.

The second operational amplifier may be further configured to convert the second current signal with the third signal value into a second voltage signal, or convert the second current signal with the fourth signal value into a second voltage signal.

Compared with the direct detection of a current signal, it is less difficult to detect a voltage signal. Therefore, in the examples of the disclosure, the signal converter 135 including the operational amplifier is provided to convert the first current signal generated in the detector into the first voltage signal and convert the second current signal into the second voltage signal. The signal value of the first voltage signal may be greater than the signal value of the first current signal, and the signal value of the second voltage signal may be greater than the signal value of the second current signal, thereby reducing the detection difficulty, improving the detection accuracy of the push-button structure, and improving the sensitivity of the push-button structure.

In an example, the controller 136 may include a judging subportion and a triggering subportion. The judging subportion may be connected to the signal converter, and configured to judge whether the first voltage signal or the second voltage signal satisfies a preset condition. The triggering subportion may be connected to the judging subportion, configured to generate a first driving signal when the first voltage signal satisfies the preset condition, and also configured to generate a second driving signal when the second voltage signal satisfies the preset condition.

Here, the preset condition may include: a signal value is greater than or equal to a signal threshold.

It is to be noted that in a case that an external force received by the push-button structure is greater than or equal to a pressure threshold, the signal value of the generated first voltage signal or the signal value of the second voltage signal may be greater than or equal to the signal threshold.

In a case that the external force received by the push-button structure is smaller than the pressure threshold, the signal value of the generated first voltage signal or the signal value of the second voltage signal may be smaller than the signal threshold.

In the disclosure, due to the arrangement of the controller 136, when the first voltage signal satisfies the preset condition, the first driving signal can be generated, so that the electronic device may trigger functions corresponding to the push-button structure. When the second voltage signal satisfies the preset condition, the second driving signal can be generated, so that the electronic device can stop executing the functions corresponding to the push-button structure 100, which contributes to reducing the situation that the functions corresponding to the push-button structure 100 are still triggered or the functions corresponding to the push-button structure 100 are stopped when a voltage signal that does not satisfies the preset condition is generated due to the accidental touch of the push-button structure 100. That is, the examples of the disclosure can improve the accuracy of the push-button structure 100.

Figure 8:
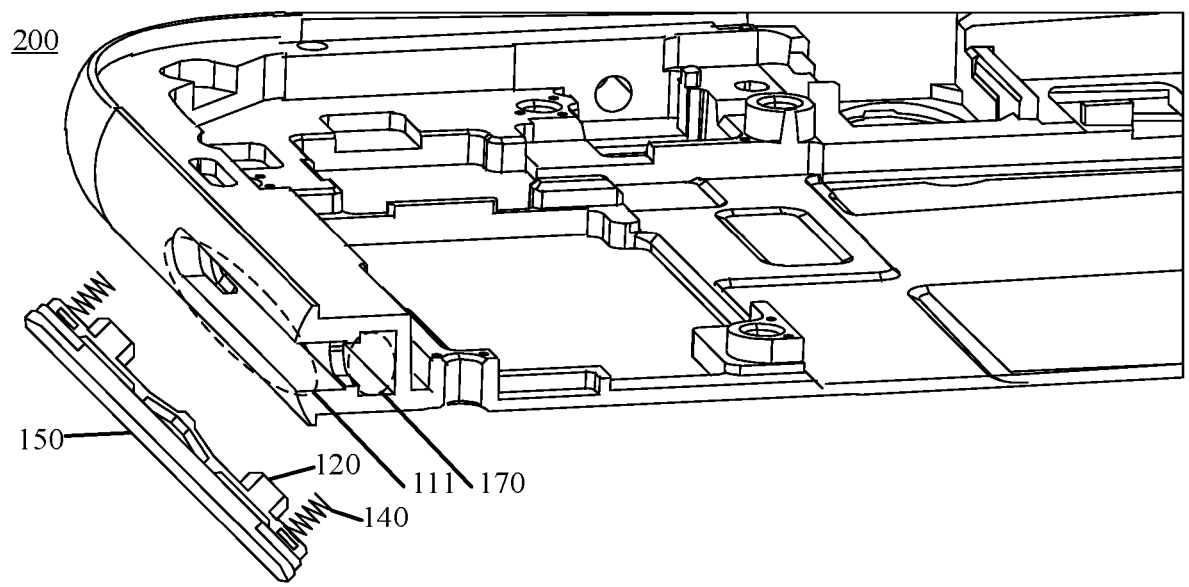
FIG. 8 is a partial schematic diagram illustrating still another electronic device according to an example.

FIG. 8 is a schematic diagram illustrating part of an electronic device 200 according to an example. As shown in FIG. 8, the electronic device 200 includes:

a push-button structure 100 provided in the disclosure, where a mounting body 110 of the push-button structure 100 is a middle frame of the electronic device 200; and a device body, provided in the middle frame, and including a functional element, where the electronic device 200 executes functions corresponding to the push-button structure 100 according to a magnetic signal output by the push-button structure 100.

The functional element here may refer to the first magnetic component 120 and the elastic block 140. The elastic block may be not only spring but also silica gel, thermoplastic polyether urethanes (TPU), steel sheet or other springing material or structure or component. The first magnetic component 120 and the elastic block 140 may have other shapes besides those as shown in the figures.

In an example, the electronic device 200 may include: a mobile phone, a tablet, a desktop computer, a television, and the like.

The device body may include a circuit board of the electronic device 200.

The functions corresponding to the push-button structure may be used to control the functional element of the electronic device to perform corresponding operations. The functional element may include various elements for executing preset functions of the electronic device, such as a microphone and a camera. In a case that the push-button structure is a volume push-button, the functional element may be a microphone.

In a case that the push-button structure is configured to increase the volume of the electronic device, a user presses the push-button structure, so that an elastic block 140 can be converted from a first form to a second form, and drive the first magnetic component 120 to move toward the second magnetic component 130. The distance between the first magnetic component 120 and the second magnetic component 130 may be reduced from a first distance to a second distance. The second magnetic component may generate a magnetic signal for causing the electronic device 200 to execute a volume increase operation.

Compared with the situation that a through hole communicating an outer side face of a middle frame with a side of the middle frame facing a rear cover of a battery is provided in an electronic device to mount a physical push-button with an FPC board and a switch component and to transmit a signal generated by circuit connection based on a user pressing operation, the examples of the disclosure have the advantages that based on an elastic block having a first form without an external action and a second form under an external action, a distance between a first magnetic component and a second magnetic component may be changed, so that the second magnetic component can generate a magnetic signal corresponding to the distance, the electronic device can be further triggered according to the magnetic signal to execute functions corresponding to the push-button structure. The through hole is not needed to be provided in the middle frame of the electronic device, thereby reducing the probability of short circuit of a motherboard of the electronic device or even damage to some functional elements caused by the fact that a liquid such as water or a corrosive substance enters the electronic device through the through hole, and improving the sealing property and corrosion resistance of the electronic device.

In addition, the disclosure ensures that, based on the form change of the elastic block under an external action, a user has a hand feel like using a physical push-button, when using the electronic device with the push-button structure, which is beneficial to improving the user experience.

In some examples, the electronic device 200 may further include:

a rear cover, covering a back of the device body and connected to the middle frame, where a width of a joint between the rear cover and the middle frame is greater than a preset width.

Here, the preset width may refer to a width of a backing adhesive on an opening side of the middle frame of the electronic device facing the rear cover, for connecting the middle frame to the rear cover in the related art.

Figure 9:
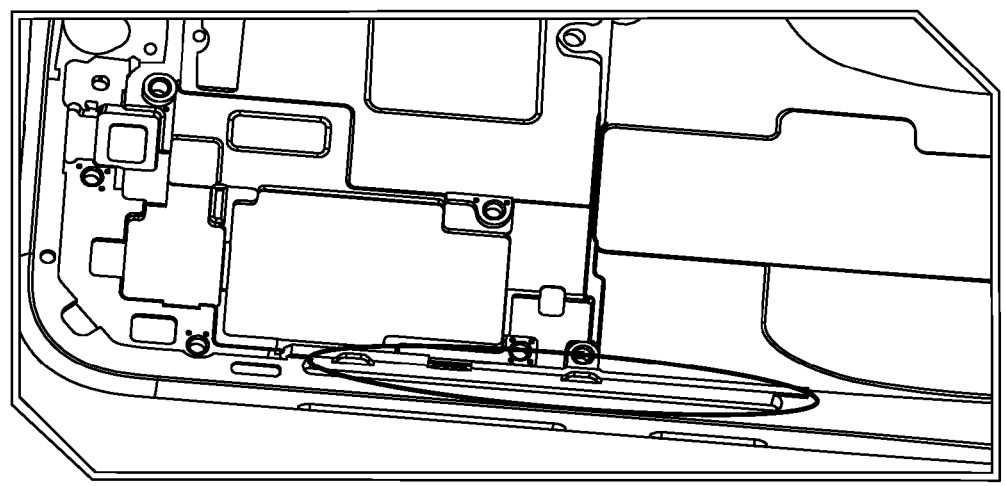
FIG. 9 is a partial schematic diagram illustrating still another electronic device according to an example.

FIG. 9 is a partial schematic diagram illustrating a middle frame of an electronic device in the related art. As shown in FIG. 9, a side of the middle frame of the electronic device facing the rear cover of the battery is provided with an opening for mounting a physical push-button in the related art. Therefore, the width of the backing adhesive for connecting the rear cover of the battery to the middle frame at the mounting position of the physical push-button may be reduced, thereby reducing the sealing performance of the electronic device. Moreover, the opening may also reduce the strength of the middle frame and reduce the quality of the middle frame.

Figure 10:
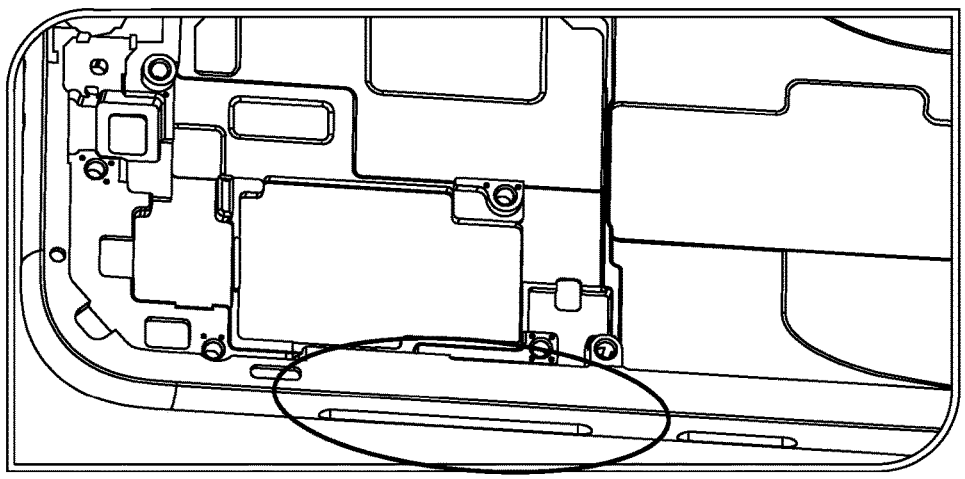
FIG. 10 is a partial schematic diagram illustrating still another electronic device according to an example.

FIG. 10 is a partial schematic diagram illustrating a middle frame of an electronic device 200 according to an example. As shown in FIG. 10, there is no opening on a side of the middle frame of the electronic device 200 facing the rear cover at the position where the push-button structure is provided, which blocks a path where a liquid such as water or a corrosive gas enters the middle frame of the electronic device from the blind hole 111, and contributes to improving the sealing performance of the electronic device. The width of the backing adhesive at a joint between the rear cover and the middle frame can be increased, which further improves the sealing performance of the electronic device. Moreover, the strength of the middle frame can also be improved, which contributes to improving the quality of the electronic device.

Figure 11:
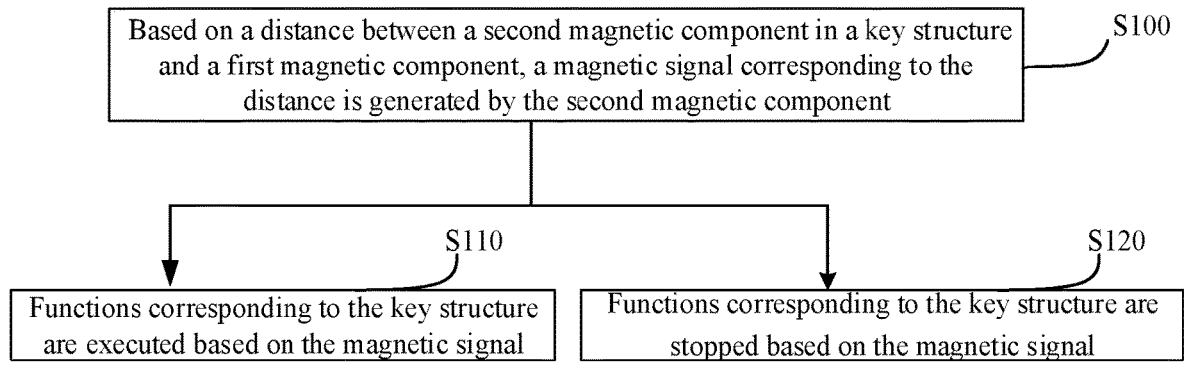
FIG. 11 is a flowchart showing a control method for an electronic device according to an example.

FIG. 11 is a flowchart showing a control method for an electronic device according to an example. The method may be applied to an electronic device 200 according to an example of the disclosure. The method includes the following steps.

In S100, based on a distance between a second magnetic component in a push-button structure and a first magnetic component, a magnetic signal corresponding to the distance is generated by the second magnetic component.

The distance between the first magnetic component and the second magnetic component may change under an external action. An elastic block in the push-button structure may have a first form without the external action and may have a second form under the external action. When the elastic block is in the first form, a first distance may exist between the first magnetic component and the second magnetic component. When the elastic block is in the second form, a second distance may exist between the first magnetic component and the second magnetic component. The first distance may be greater than the second distance.

In S110, functions corresponding to the push-button structure are executed based on the magnetic signal.

In S120, functions corresponding to the push-button structure are stopped based on the magnetic signal.

Compared with the situation that a through hole communicating an outer side face of a middle frame with a side of the middle frame facing a rear cover of a battery is provided in an electronic device to mount a physical push-button and to transmit a signal generated by circuit connection based on a user pressing operation, the examples of the disclosure have the advantages that based on a first magnetic component located in a blind hole formed in an outer surface of a mounting body and an elastic block having a first form without an external action and a second form under an external action, a distance between the first magnetic component and a second magnetic component can be changed, so that the second magnetic component can generate a magnetic signal corresponding to the distance, the electronic device can be enabled to execute functions corresponding to the push-button structure according to the magnetic signal. The through hole is not needed to be provided in the middle frame of the electronic device, thereby reducing the probability of short circuit of a motherboard of the electronic device or damage to some functional elements caused by the fact that a liquid such as water or a corrosive substance enters the electronic device through the through hole, and improving the sealing performance and corrosion resistance of the electronic device.

In addition, the disclosure can ensure that, due to the form change of the elastic block under an external action, a user has a hand feel when using the electronic device with the push-button structure as that when using the physical push-button in the related art, which is beneficial to improving the user experience.

In some examples, S110 may include that: the magnetic signal is converted into a first voltage signal when a direction of the magnetic signal is consistent with a preset direction, and a first driving signal is generated when the first voltage signal satisfies a preset condition, where the electronic device executes the functions corresponding to the push-button structure according to the first driving signal.

In an example, the magnetic signal may be a current signal generated when a magnetic flux induced by an induction portion in the second magnetic component changes. The induction portion may include at least one coil.

The elastic block may be switched from the first form to the second form under an external action, the distance between the first magnetic component and the second magnetic component may be reduced from the first distance to the second distance, the distance between the first magnetic component and the coil may be also reduced, and the magnetic flux passing through the coil may be increased. Therefore, a first current signal may be generated in the coil, and a direction of the first current signal may be a first direction. Here, the direction of the first current signal may be determined according to a right-hand rule.

In a case that the magnetic signal is a first current signal, S110 may further include: a first operational amplifier converts a first current signal with a first signal value into a first current signal with a second signal value. The first signal value may be smaller than the second signal value.

It will be appreciated that the signal value of the first current signal with the first signal value generated in the coil is small, and it is difficult and inaccurate to directly detect the first current signal with the first signal value. If a controller with higher accuracy is provided to detect the first current signal with the first signal value, the hardware cost may be increased. Therefore, in the examples of the disclosure, the first current signal with the amplified signal value can be detected, thereby reducing the detection difficulty, improving the detection accuracy of the push-button structure, and improving the sensitivity of the push-button structure.

In a case that the magnetic signal is a first current signal, S110 may further include: the first operational amplifier converts the first current signal into a first voltage signal. The signal value of the first current signal may be smaller than the signal value of the first voltage signal.

Compared with the direct detection of a current signal, it is less difficult to detect a voltage signal. Therefore, in the examples of the disclosure, the first current signal can be converted into the first voltage signal and then the first voltage signal can be detected. The signal value of the first voltage signal may be greater than the signal value of the current signal, thereby reducing the detection difficulty, improving the detection accuracy of the push-button structure, and improving the sensitivity of the push-button structure.

In some examples, S120 may include that: the magnetic signal is converted into a second voltage signal when the direction of the magnetic signal is opposite to the preset direction, and a second driving signal is generated when the second voltage signal satisfies the preset condition, where the electronic device stops executing the functions corresponding to the push-button structure according to the second driving signal.

Here, the preset condition may include: a signal value is greater than or equal to a signal threshold.

It is to be noted that in a case that an external force received by the push-button structure is greater than or equal to a pressure threshold, the signal value of the generated first voltage signal or the signal value of the second voltage signal may be greater than or equal to the signal threshold.

In a case that the external force received by the push-button structure is smaller than the pressure threshold, the signal value of the generated first voltage signal or the signal value of the second voltage signal may be smaller than the signal threshold.

When the external action is cancelled or stopped, the elastic block may be converted from the second form to the first form, the distance between the first magnetic component and the second magnetic component may be increased from the second distance to the first distance, the distance between the first magnetic component and the coil may be also increased, and the magnetic flux passing through the coil may be decreased. In such a case, a second current signal may be generated in the coil, a direction of the second current signal may be a second direction, and the direction of the second current signal may also be determined according to the right-hand rule. Here, the first direction can be opposite to the second direction.

In a case that the magnetic signal is a second current signal, S120 may further include that: a second operational amplifier converts a second current signal with a third signal value into a second current signal with a fourth signal value. The third signal value may be smaller than the fourth signal value.

It will be appreciated that the signal value of the second current signal with the third signal value generated in the coil is small, and it is difficult and inaccurate to directly detect the second current signal with the third signal value. If a controller with higher sensitivity is provided to detect the second current signal with the third signal value, the hardware cost may be increased. In the examples of the disclosure, the second current signal with the amplified signal value can be detected, thereby reducing the detection difficulty, improving the detection accuracy of the push-button structure, and improving the sensitivity of the push-button structure.

In a case that the magnetic signal is a second current signal, S120 may further include that: the second operational amplifier converts the second current signal into a second voltage signal. The signal value of the second current signal may be smaller than the signal value of the second voltage signal.

Compared with the direct detection of a current signal, it is less difficult to detect a voltage signal. Therefore, in the examples of the disclosure, the second current signal may be converted into the second voltage signal and then the second voltage signal can be detected. The signal value of the second voltage signal may be greater than the signal value of the second current signal, thereby reducing the detection difficulty, improving the detection accuracy of the push-button structure, and improving the sensitivity of the push-button structure.

Moreover, in the disclosure, when the first voltage signal satisfies the preset condition, the first driving signal can be generated, so that the electronic device may trigger functions corresponding to the push-button structure. When the second voltage signal satisfies the preset condition, the second driving signal can be generated, so that the electronic device can stop executing the functions corresponding to the push-button structure, which can reduce the situation that the functions corresponding to the push-button structure are still triggered or the functions corresponding to the push-button structure 100 are stopped when a voltage signal that does not satisfies the preset condition is generated due to the accidental touch of the push-button structure. That is, the examples of the disclosure can improve the accuracy of the push-button structure.

Other examples of the disclosure will be apparent to those skilled in the art from consideration of the specification and practice of the disclosure disclosed here. The disclosure is intended to cover any variations, uses, or adaptations of the disclosure following the general principles thereof and including such departures from the disclosure as come within known or customary practice in the art. It is intended that the specification and examples be considered as exemplary only, with a true scope and spirit of the disclosure being indicated by the appended claims.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A push-button structure, comprising:
   a mounting body, wherein an outer surface of the mounting body is at least partially recessed inward to form a blind hole;
   a first magnetic component, disposed at least partially in the blind hole;
   a second magnetic component, disposed at least partially on an inner surface of the mounting body and positioned symmetrically with the first magnetic component on an opposite side of the mounting body, for generating, based on a distance to the first magnetic component, a magnetic signal corresponding to the distance; and
   an elastic block, disposed at least partially in the blind hole, the elastic block having a first form without any external action and a second form under an external action,
   wherein when the elastic block is in the first form, a first distance exists between the first magnetic component and the second magnetic component; when the elastic block is in the second form, a second distance exists between the first magnetic component and the second magnetic component; and the first distance is greater than the second distance,
   wherein the second magnetic component comprises:
      a detector, configured to generate the magnetic signal when a distance to the first magnetic component changes;
      a signal converter, connected to the detector, and configured to:
         convert the magnetic signal into a first voltage signal by using a first sub-converter when a direction of the magnetic signal is consistent with a preset direction, and
         convert the magnetic signal into a second voltage signal by using a second sub-converter when the direction of the magnetic signal is opposite to the preset direction; and
      a controller, connected to the signal converter, and configured to:
         generate a first driving signal when the first voltage signal satisfies a preset condition, wherein an electronic device executes functions corresponding to the push-button structure according to the first driving signal, and
         generate a second driving signal when the second voltage signal satisfies the preset condition, wherein the electronic device stops executing the functions corresponding to the push-button structure according to the second driving signal.

2. The push-button structure according to claim 1, comprising:
   a push-button housing, disposed on an outer surface of the first magnetic component and configured to receive the external action.

3. The push-button structure according to claim 2, wherein
   the elastic block is disposed at least partially between the first magnetic component and a bottom of the blind hole; or,
   the elastic block is disposed at least partially between the push-button housing and the bottom of the blind hole.

4. The push-button structure according to claim 3, wherein
   the elastic block that is disposed at least partially between the first magnetic component and the bottom of the blind hole comprise s elastic plastic;
   when the elastic plastic is in the first form, the elastic plastic has a first length;
   when the elastic plastic is in the second form, the elastic plastic has a second length; and
   the second length is smaller than the first length.

5. The push-button structure according to claim 3, wherein the elastic block comprises at least one spring;
   when the at least one spring is disposed between the first magnetic component and the bottom of the blind hole, the at least one spring is capable of being compressed by the first magnetic component and the bottom of the blind hole to change a length of the at least one spring when being switched between the first form and the second form; or
   when the at least one spring is disposed between the push-button housing and the bottom of the blind hole, the at least one spring is capable of being compressed by the push-button housing and the bottom of the blind hole to change the length of the at least one spring when being switched between the first form and the second form.

6. The push-button structure according to claim 5, wherein
   when the at least one spring is disposed between the push-button housing and the bottom of the blind hole, the length of the at least one spring in the first form is greater than a thickness of the first magnetic component.

7. The push-button structure according to claim 1, wherein a partition is provided in the blind hole, and a receiving space is formed between the partition and a bottom of the blind hole;
   when the elastic block is in the first form, the first magnetic component is located in the blind hole outside the receiving space; and
   when the elastic block is in the second form, the first magnetic component at least partially enters the receiving space through an opening of the partition.

8. The push-button structure according to claim 1, wherein the second magnet is configured to:
   generate a first magnetic signal, when the elastic block is switched from the first form to the second form, to trigger the electronic device to execute functions corresponding to the push-button structure; and generate a second magnetic signal, when the elastic block is switched from the second form to the first form, to stop executing the functions corresponding to the push-button structure.

9. An electronic device, comprising:
a push-button structure, which comprises:
  a mounting body, wherein the mounting body is a middle frame of the electronic device, and an outer surface of the mounting body is at least partially recessed inward to form a blind hole;
  a first magnetic component, disposed at least partially in the blind hole;
  a second magnetic component, disposed at least partially on an inner surface of the mounting body and positioned symmetrically with the first magnetic component on an opposite side of the mounting body, for generating, based on a distance to the first magnetic component, a magnetic signal corresponding to the distance; and
  an elastic block, disposed at least partially in the blind hole and having a first form without an external action and a second form under an external action,
  wherein when the elastic block is in the first form, a first distance exists between the first magnetic component and the second magnetic component; when the elastic block is in the second form, a second distance exists between the first magnetic component and the second magnetic component; and the first distance is greater than the second distance; and
a device body, which is disposed in the middle frame and comprises a functional element, wherein the electronic device executes functions corresponding to the push-button structure according to a magnetic signal output by the push-button structure,
wherein the second magnetic component comprises:
  a detector, configured to generate the magnetic signal when a distance to the first magnetic component changes;
  a signal converter, connected to the detector, and configured to:
    convert the magnetic signal into a first voltage signal by using a first sub-converter when a direction of the magnetic signal is consistent with a preset direction, and
    convert the magnetic signal into a second voltage signal by using a second sub-converter when the direction of the magnetic signal is opposite to the preset direction; and
  a controller, connected to the signal converter, and configured to:
    generate a first driving signal when the first voltage signal satisfies a preset condition, wherein the electronic device executes functions corresponding to the push-button structure according to the first driving signal, and
    generate a second driving signal when the second voltage signal satisfies the preset condition, wherein the electronic device stops executing the functions corresponding to the push-button structure according to the second driving signal.

10. The electronic device according to claim 9, further comprising:
  a rear cover, covering a back of the device body and connected to the middle frame, wherein a width of a joint between the rear cover and the middle frame is greater than a preset width; and
  a push-button housing, disposed on an outer surface of the first magnetic component and configured to receive the external action.

11. The electronic device according to claim 10, wherein the elastic block is disposed at least partially between the first magnetic component and a bottom of the blind hole; or,
  the elastic block is disposed at least partially between the push-button housing and the bottom of the blind hole.

12. The electronic device according to claim 11, wherein the elastic block that is disposed at least partially between the first magnet and the bottom of the blind hole comprises elastic plastic;
  when the elastic plastic is in the first form, the elastic plastic has a first length;
  when the elastic plastic is in the second form, the elastic plastic has a second length; and
  the second length is smaller than the first length.

13. The electronic device according to claim 11, wherein the elastic block comprises at least one spring;
  when the at least one spring is disposed between the first magnetic component and the bottom of the blind hole, the at least one spring is capable of being compressed by the first magnetic component and the bottom of the blind hole to change a length of the at least one spring when being switched between the first form and the second form; or
  when the at least one spring is disposed between the push-button housing and the bottom of the blind hole, the at least one spring is capable of being compressed by the push-button housing and the bottom of the blind hole to change the length of the at least one spring when being switched between the first form and the second form, wherein the length of the at least one spring in the first form is greater than a thickness of the first magnetic component.

14. The electronic device according to claim 9, wherein a partition is provided in the blind hole, and a receiving space is formed between the partition and a bottom of the blind hole;
  when the elastic block is in the first form, the first magnetic component is located in the blind hole outside the receiving space; and
  when the elastic block is in the second form, the first magnetic component at least partially enters the receiving space through an opening of the partition.

15. The electronic device according to claim 9, wherein the second magnet is configured to:
  generate a first magnetic signal, when the elastic block is switched from the first form to the second form, to trigger the electronic device to execute functions corresponding to the push-button structure; and
  generate a second magnetic signal, when the elastic block is switched from the second form to the first form, to stop executing the functions corresponding to the push-button structure.

16. A control method for an electronic device, comprising:
generating a magnetic signal corresponding to a distance between a second magnetic component and a first magnetic component in a push-button structure by the second magnetic component, wherein the distance between the first magnetic component and the second magnetic component changes under an external action, an elastic block in the push-button structure has a first form without the external action and a second form under the external action; when the elastic block is in the first form, a first distance exists between the first magnetic component and the second magnetic component; when the elastic block is in the second form, a second distance exists between the first magnetic component and the second magnetic component; and the first distance is greater than the second distance; and executing or stopping executing functions corresponding to the push-button structure based on the magnetic signal, wherein the electronic device comprises:

the push-button structure, which comprises:

a mounting body, wherein the mounting body is a middle frame of the electronic device, and an outer surface of the mounting body is at least partially recessed inward to form a blind hole;

the first magnetic component, disposed at least partially in the blind hole;

the second magnetic component, disposed at least partially on an inner surface of the mounting body and positioned symmetrically with the first magnetic component on an opposite side of the mounting body, for generating, based on the distance between the second magnetic component and the first magnetic component, the magnetic signal corresponding to the distance; and the elastic block, disposed at least partially in the blind hole and having the first form without the external action and the second form under the external action; and a device body, which is disposed in the middle frame and comprises a functional element, wherein executing functions corresponding to the push-button structure based on the magnetic signal comprises:

converting the magnetic signal into a first voltage signal when a direction of the magnetic signal is consistent with a preset direction, and generating a first driving signal when the first voltage signal satisfies a preset condition, wherein the electronic device executes the functions corresponding to the push-button structure according to the first driving signal.

17. The control method according to claim 16, wherein stopping executing functions corresponding to the push-button structure based on the magnetic signal comprises:

converting the magnetic signal into a second voltage signal when the direction of the magnetic signal is opposite to a preset direction, and generating a second driving signal when the second voltage signal satisfies the preset condition, wherein the electronic device stops executing the functions corresponding to the push-button structure according to the second driving signal.

* * * * *